(12) United States Patent
Yamamoto et al.

(10) Patent No.: US 6,602,722 B2
(45) Date of Patent: Aug. 5, 2003

(54) PROCESS FOR FABRICATING CAPACITOR HAVING DIELECTRIC LAYER WITH PERVSKITE STRUCTURE AND APPARATUS FOR FABRICATING THE SAME

(75) Inventors: Ichiro Yamamoto, Tokyo (JP); Toshihiro Iizuka, Tokyo (JP); Yoshitake Kato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/135,620

(22) Filed: Apr. 30, 2002

(65) Prior Publication Data

US 2002/0119617 A1 Aug. 29, 2002

Related U.S. Application Data

(62) Division of application No. 09/736,562, filed on Dec. 13, 2000, now abandoned.

(51) Int. Cl.[7] ............................................. H01G 7/06
(52) U.S. Cl. ........................................... 438/3; 438/240
(58) Field of Search ................................. 438/3, 240

(56) References Cited

U.S. PATENT DOCUMENTS

| | | |
|---|---|---|
| 5,434,102 A | 7/1995 | Watanabe et al. |
| 5,858,851 A | 1/1999 | Yamagata et al. |
| 6,010,927 A | 1/2000 | Jones, Jr. et al. |

FOREIGN PATENT DOCUMENTS

| | | |
|---|---|---|
| JP | 11-54721 | 2/1999 |
| JP | 11-177048 | 7/1999 |
| JP | 11-243177 | 9/1999 |
| JP | 11-297964 | 10/1999 |
| JP | 2000-332209 | 11/2000 |
| JP | 2000-349254 | 12/2000 |

OTHER PUBLICATIONS

"In–situ Multi–Step (IMS) CVD Process of (Ba, Sr) $TiO_3$ using Hot Wall Batch Type reactor for DRAM Capacitor Dielectrics" by M. Kiyotoshi, et al., 1999 Symposium.

"Process for Fabricating Capacitor Having Dielectric Layer With Perovskite Structure and Apparatus for Fabricating the Same", 1999.

*Primary Examiner*—Jey Tsai
(74) *Attorney, Agent, or Firm*—Scully, Scott, Murphy & Presser

(57) ABSTRACT

A barium strontium titanate is the ferroelectric substance with the perovskite structure available for a capacitor as a dielectric layer, and is crystallized through a high temperature heat treatment, in which the barium strontium titanate is further subjected to a low temperature heat treatment under the crystallizing temperature of the barium strontium titanate for eliminating impurities such as carbon and hydrogen therefrom so that the leakage current is drastically reduced.

16 Claims, 7 Drawing Sheets

PROCESS FOR FABRICATING CAPACITOR HAVING DIELECTRIC LAYER WITH PERVSKITE STRUCTURE AND APPARATUS FOR FABRICATING THE SAME

CROSS-REFERENCE TO RELATED APPLICATION

This is a divisional of application Ser. No. 09/736,562 filed on Dec. 13, 2000 abandoned.

FIELD OF THE INVENTION

This invention relates to a capacitor incorporated in a semiconductor device and, more particularly, to a process for forming a capacitor and an apparatus for forming the capacitor.

DESCRIPTION OF THE RELATED ART

A dynamic random access memory is a typical example of the semiconductor device, and the dynamic random access memory cell is implemented by a series combination of an access transistor and a storage capacitor. The circuit components of the dynamic random access memory device have been scaled down. Although the area assigned to each storage capacitor is reduced, a data bit to be stored requires the storage capacitor to have a large capacitance. Dielectric material with the perovskite structure has a large dielectric constant, and is attractive to the storage capacitor. Barium strontium titanate ((Ba, Sr)$TiO_3$ and strontium titanate $SrTiO_3$ are examples of the material with the perovskite structure.

Using the dielectric material with the perovskite structure, the prior art storage capacitor is fabricated as follows. First, a ruthenium layer is patterned into a lower capacitor electrode. The barium strontium titanate is deposited over the lower capacitor electrode by using a chemical vapor deposition at 400 degrees in centigrade. The barium strontium titanate is treated at 650 degrees in centigrade for 10 minutes, and is crystallized. The chemical vapor deposition and the crystallization are repeated several times. Finally, ruthenium is deposited over the barium strontium titanate layer, and the ruthenium layer is patterned into an upper capacitor electrode.

The prior art storage capacitor exhibits a large capacitance. However, the data holding characteristics are not acceptable. This is because of the fact that the leakage current flows across the barium strontium titanate layer. Moreover, the dielectric layer of barium strontium titanate is deteriorated, and the dielectric constant is lowered.

SUMMARY OF THE INVENTION

It is therefore an important object of the present invention to provide a capacitor which exhibits a large capacitance without serious leakage current and free from the deterioration of the dielectric layer.

The present inventors contemplated the problem, and found non-ignoreable amount of impurity in the barium strontium titanate. The impurity was carbon and hydrogen, which were considered to be produced through an elimination reaction at 300 degrees to 400 degrees in centigrade. The present inventors concluded that a low temperature heat treatment was required for the impurity.

The present inventors searched database for the low temperature heat treatment against the impurity. Two documents were found. One of the documents was disclosed by M. Kiyotoshi et al. in 1999 Symposium on VLSI Technology Digest of Technical Papers, p.p. 101–102. The paper taught a crystallization of barium strontium titanate through a heat treatment. However, the paper is silent to the low temperature heat treatment against the impurity.

The other document is Japanese Patent Publication of Unexamined Application No. 11-243177. The Japanese Patent Publication of Unexamined Application taught two-step formation of barium strontium titanate layer through a high temperature heat treatment. However, the Japanese Patent Publication of Unexamined Application was silent to the low temperature heat treatment against the impurity.

To accomplish the object, the present invention proposes to eliminate the impurity from the substance with the perovskite structure.

In accordance with one aspect of the present invention, there is provided a process for fabricating a capacitor comprising the steps of a) preparing a semiconductor structure having a semiconductor substrate, b) forming a first electrode on the semiconductor structure, c) depositing a complex oxide expressed as $ABO_3$ on the first electrode and d) completing a capacitor through a high temperature heat treatment for crystallizing the complex oxide; a low temperature heat treatment for eliminating impurities causative of degradation from the complex oxide and forming a second electrode on the complex oxide.

In accordance with another aspect of the present invention, there is provided an apparatus for fabricating a capacitor comprising a first chamber for depositing a complex oxide expressed as $ABO_3$ on a semiconductor structure having a first electrode, a second chamber for a high temperature heat treatment through which the complex oxide is crystallized, a third chamber for a low temperature heat treatment through which impurity causative of degradation is eliminated from the complex oxide and a transfer system for conveying the semiconductor structure from one of the first to third chambers to another without exposing the semiconductor structure to the atmosphere.

BRIEF DESCRIPTION OF THE DRAWINGS

The features and advantages of the process and the apparatus will be more clearly understood from the following description taken in conjunction with the accompanying drawings in which.

DESCRIPTION OF THE PREFERRED EMBODIMENTS

Figure 1:
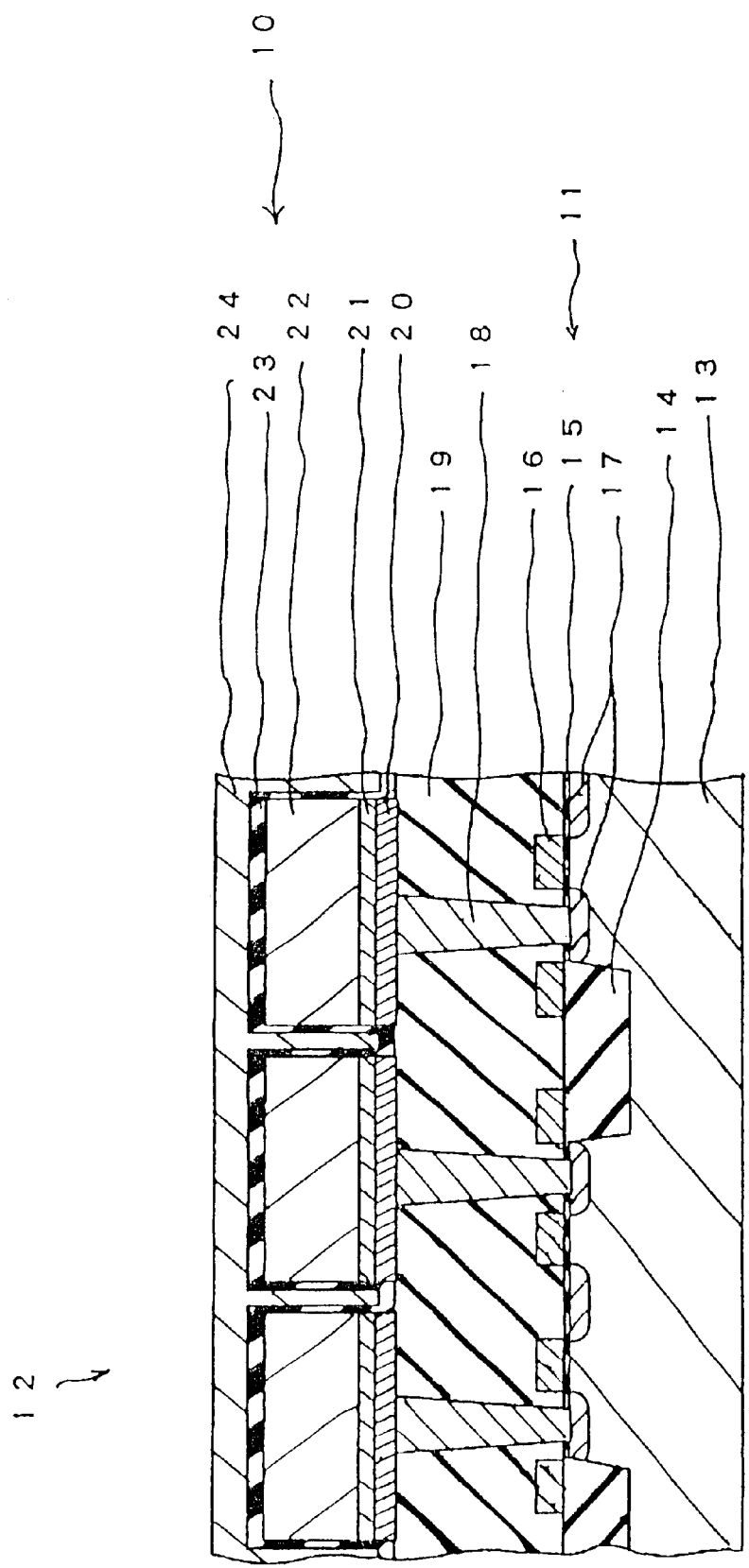
FIG. 1 is a cross sectional view showing the structure of a dynamic random access memory cell incorporated in a semiconductor device according to the present invention.

Referring to FIG. 1 of the drawings, a dynamic random access memory cell 12 is fabricated on a p-type silicon substrate 13, and forms a part of a dynamic random access memory device. The dynamic random access memory cell 12 is implemented by a series combination of a storage capacitor 10 and a metal-oxide-semiconductor field effect transistor 11.

Insulating material is selectively grown in the p-type silicon substrate 13, and forms an isolating region 14. The isolating region 14 defines plural active regions in the p-type silicon substrate 13. In this instance, each of the active regions is assigned to a pair of dynamic random access memory cells 12. Since the dynamic random access memory cells are similar in structure to one another, only one of the dynamic random access memory cells 12 is described in detail.

The active region is covered with a thin gate oxide layer 15, and a gate electrode 16 passes over the thin gate oxide layer 15. N-type source/drain regions 17 are formed in the active region, and are located on both sides of the gate electrode 16. The gate oxide layer 15, the gate electrode 16 and the n-type source/drain regions 17 as a whole constitute the metal-oxide-semiconductor field effect transistor 11.

The metal-oxide-semiconductor field effect transistor 11 is covered with a thick insulating layer 19, and a contact hole is formed in the thick insulating layer 19. The n-type source region 17 is exposed to the contact hole. A polysilicon plug 18 fills the contact hole, and is held in contact with the n-type source region 17. The storage capacitor 10 is formed on the thick insulating layer 19, and is electrically connected through the polysilicon plug 18 to the n-type source region 17 of the metal-oxide-semiconductor field effect transistor 10.

A silicon contact layer 20 and an anti-silicon diffusion conductive layer 21 are laminated on the thick insulating layer 19, and the silicon contact layer 20 is held in contact with the polysilicon plug 18. A lower capacitor electrode 22 is formed on the anti-silicon diffusion conductive layer 21, and the entire surface of the lower capacitor electrode 22, the side surface of the anti-silicon diffusion conductive layer 21 and the side surface of the silicon contact layer 20 are covered with a dielectric layer 23. The dielectric layer 23 is covered with an upper capacitor electrode 24.

The dielectric layer 23 is formed of material with the perovskite structure. In this instance, the dielectric layer 23 is formed of barium strontium titanate (Ba, Sr) $TiO_3$. Strontium titanate $SrTiO_3$ is available for the dielectric layer 23. These kinds of material form extremely thin layers, and are appropriate to the storage capacitor 10.

The dynamic random access memory cell 12 is fabricated through a process shown in FIGS. 2A to 2H. The process starts with preparation of a p-type silicon substrate 13. Insulating material is selectively grown, and forms the isolating region 14. The isolating region 14 defines the active regions.

Figure 2A:
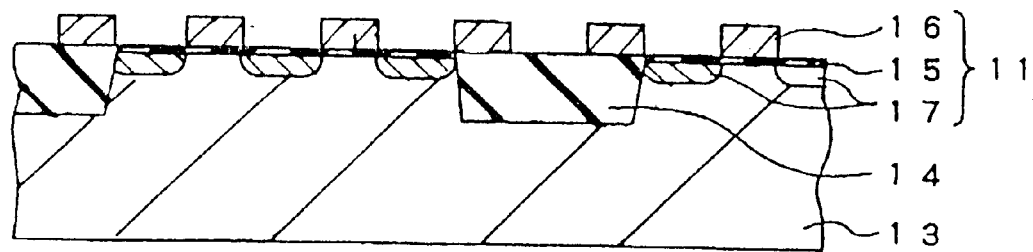
FIGS. 2A to 2H are cross sectional views showing a process for fabricating the semiconductor device according to the present invention.

The field effect transistor 11 is fabricated on the active region through a conventional process. In detail, the gate insulating layer 15 is grown on the active region. The gate electrode 16 is patterned, and extends over the gate insulating layer 15. N-type dopant impurity is introduced into the active region, and forms the n-type source and drain regions 17 on both sides of the gate electrode 16. The resultant semiconductor structure is shown in FIG. 2A.

Figure 2B:
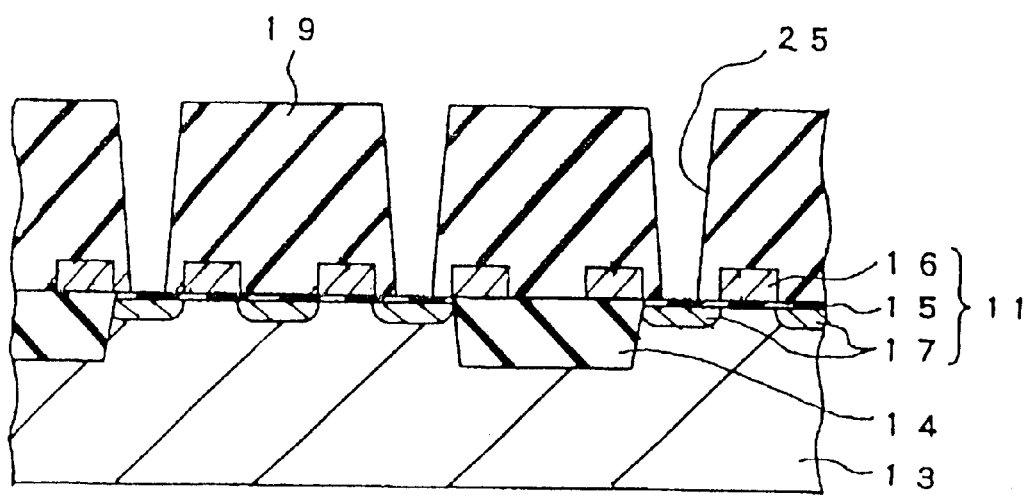

Subsequently, silicon dioxide, i.e., $SiO_2$ is deposited to 300 nanometers thick over the entire surface of the resultant semiconductor structure by using a chemical vapor deposition, and forms the thick insulating layer 19. A photo-resist etching mask (not shown) is formed on the thick insulating layer 19, and the thick insulating layer 19 is selectively etched away. Via-holes 25 are formed in the thick insulating layer 19, and the n-type source and drain regions 17 are exposed to the via-holes 25, respectively. The resultant semiconductor structure is shown in FIG. 2B.

Figure 2C:
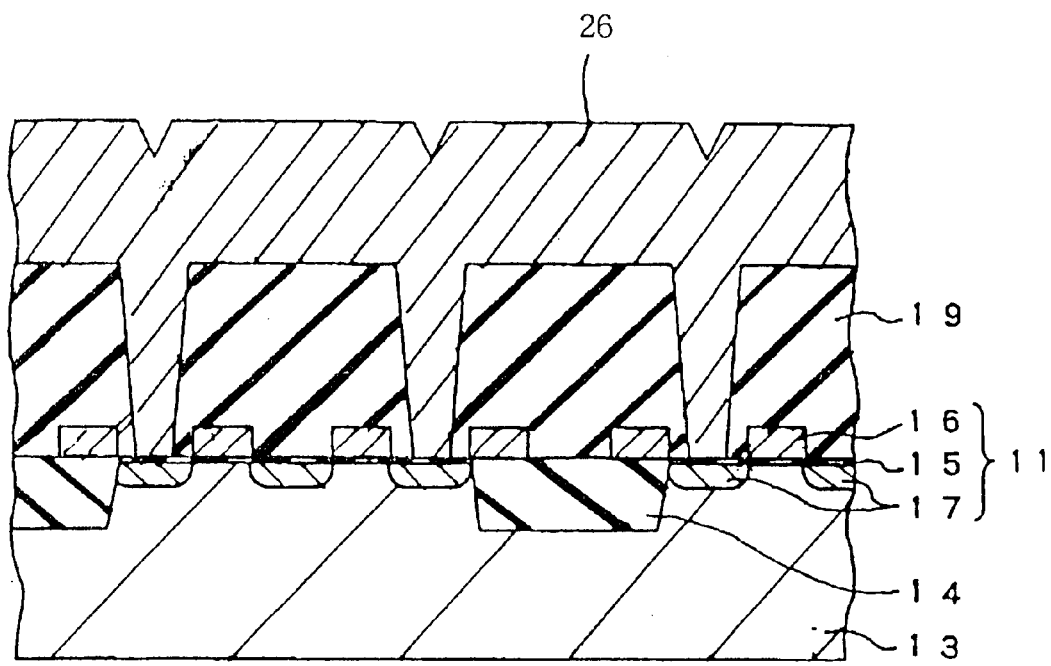

Subsequently, phosphorous-doped amorphous silicon is deposited over the entire surface of the resultant semiconductor structure by using a chemical vapor deposition, and forms a phosphorous-doped amorphous silicon layer 26 as shown in FIG. 2C. The phosphorous-doped amorphous silicon layer 26 is treated with heat at 700 degrees to 850 degrees in centigrade. The phosphorous-doped amorphous silicon is crystallized, and is converted to phosphorous-doped polysilicon.

Figure 2D:
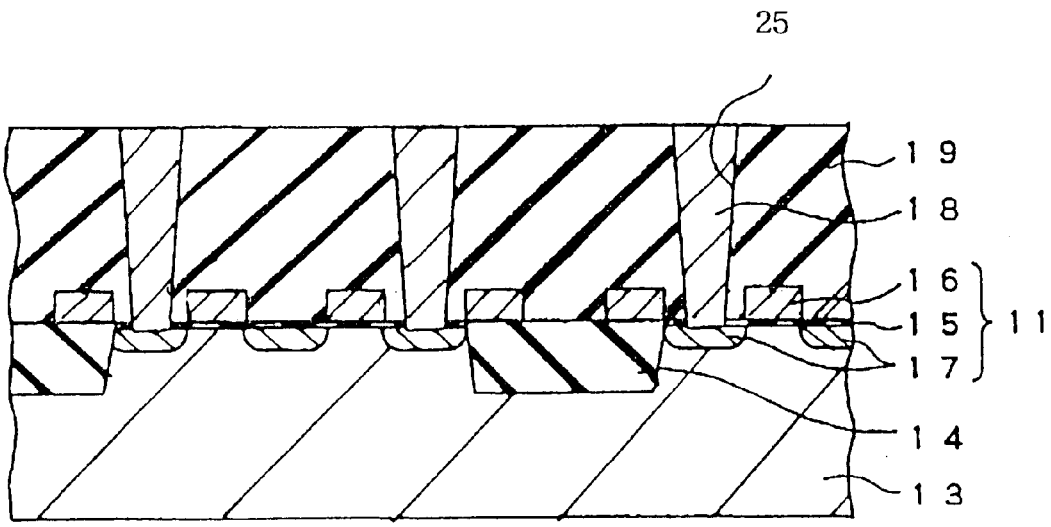

The phosphorous-doped polysilicon is etched without any etching mask until the thick insulating layer 19 is exposed, again. Then, the phosphorous-doped polysilicon is left in the via-holes 25. Thus, the via-holes 25 are plugged with the polysilicon plugs 18. The resultant semiconductor structure is shown in FIG. 2D.

Figure 2E:
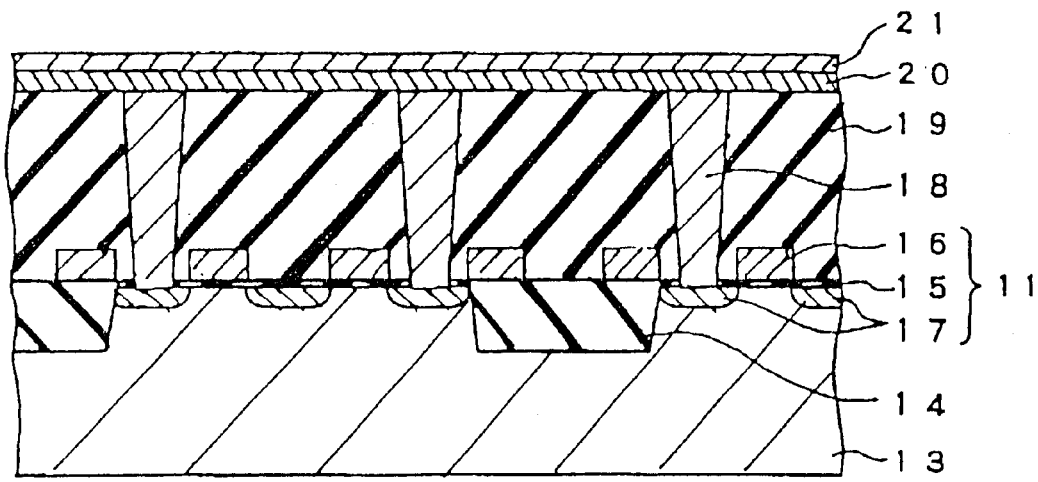

Subsequently, titanium Ti is deposited to 30 nanometers thick over the entire surface of the resultant semiconductor structure by using a sputtering, and forms a titanium layer. Thereafter, titanium nitride TiN is deposited to 50 nanometers thick over the titanium layer by using a sputtering, and forms a titanium nitride layer. The titanium layer and the titanium nitride layer as a whole constitute the anti-silicon diffusion conductive layer 21. The resultant semiconductor structure is placed in nitrogen atmosphere, and a rapid thermal annealing is carried out in the nitrogen atmosphere. The titanium reacts with the silicon, and the titanium silicide $TiSi_2$ forms the silicon contact layer 20. The resultant semiconductor structure is shown in FIG. 2E.

Figure 2F:
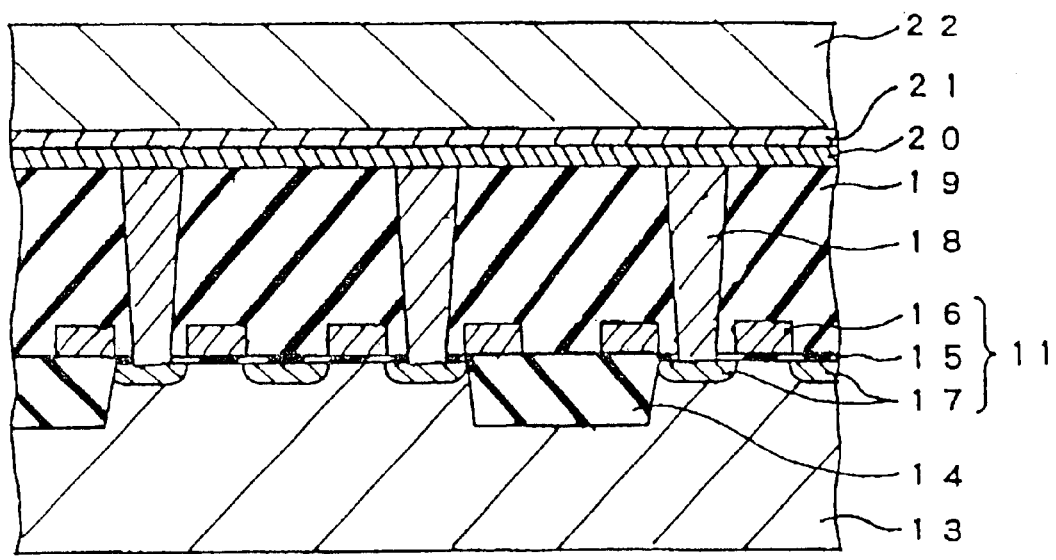

Subsequently, the resultant semiconductor structure is placed in a sputtering chamber of a direct current sputtering system, and ruthenium is deposited to 100 nanometers thick over the anti-silicon diffusion conductive layer 21, and forms a ruthenium layer 22 as shown in FIG. 2F.

Figure 2G:
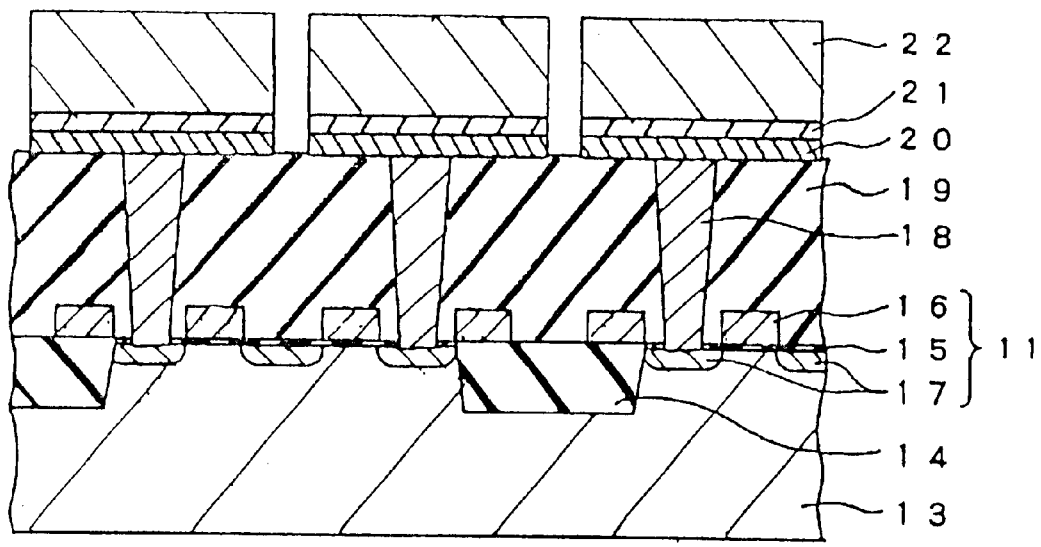

A photo-resist etching mask is patterned on the ruthenium layer 22, and the ruthenium layer 22, the anti-silicon diffusion conductive layer 21 and the silicon contact layer 20 are selectively etched by using a plasma-assisted etching technique. Gaseous mixture containing oxygen and chlorine is used in the plasma-assisted etching. The ruthenium layer 22, the anti-silicon diffusion conductive layer 21 and the silicon contact layer 20 are patterned into the lower capacitor electrodes 22/21/20. The resultant semiconductor structure is shown in FIG. 2G.

Subsequently, substance with the perovskite structure such as, for example, barium strontium titanate (Ba, Sr)$TiO_3$ is deposited to 20 nanometers thick over the entire surface of the resultant semiconductor structure by using a thermal chemical vapor deposition. The barium strontium titanate is produced from gaseous mixture containing barium bis-dipivaloylmethanate Ba(DPM)$_2$, strontium bis-dipivaloylmethanate Sr(DPM)$_2$, bis-dipivaloylmethanate titanisopropoxide Ti(i-OC$_3$H$_7$)$_2$ (DPM)$_2$ and oxygen at 400 degrees to 480 degrees in centigrade. Bis-dipivaloylmethanate is abbreviated as "DPM" in the above chemical formulae.

The substance with the perovskite structure is produced from the following reactant gases. The first reactant gas is one of or both of Ba(DPM)$_2$ and Sr(DPM)$_2$. The second reactant gas is one of or more than one of Ti(i-OC$_3$H$_7$)$_2$ (DPM)$_2$, TiO(DPM)$_2$ and Ti(i-OC$_3$H$_7$)$_2$(DPM)$_2$. The third reactant gas is oxygen. The substance with the perovskite structure is produced form the gaseous mixture containing the first reactant gas, the second reactant gas and the third reactant gas.

Subsequently, tile substance is crystallized in high-temperature inert gas atmosphere. The inert gas atmosphere contains oxygen, and the oxygen is fallen within the range from zero to 5 percent. The heat treatment is carried out at the crystallizing temperature ranging from 650 degrees to 900 degrees in centigrade. The heat treatment is, by way of example, carried out in nitrogen atmosphere containing the oxygen at 400 degrees in centigrade for an hour and, thereafter, in nitrogen atmosphere containing the oxygen at 750 degrees in centigrade for 30 seconds by using a rapid thermal annealing technique.

Figure 2H:
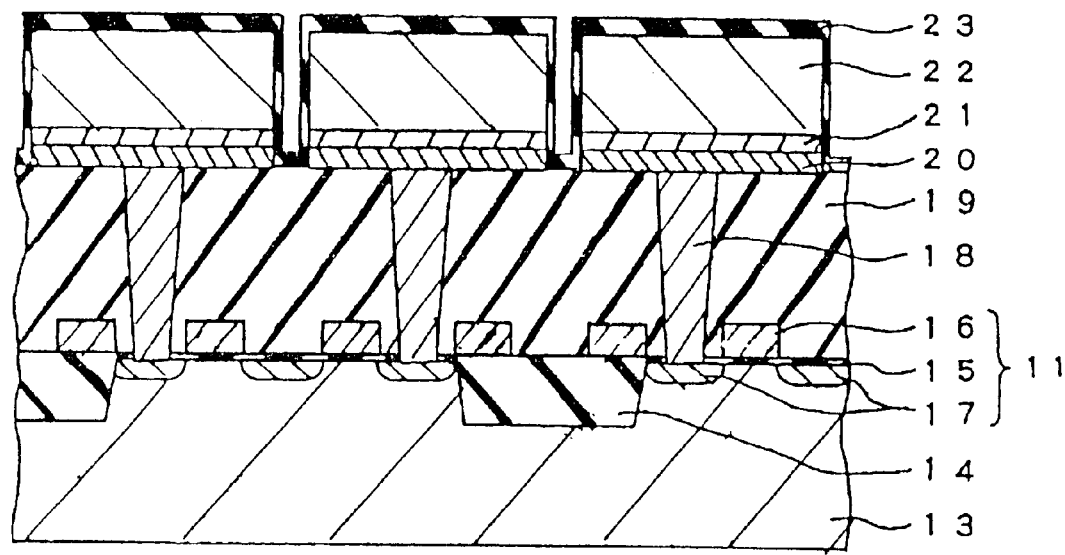

In case where the substance with the perovskite structure is barium strontium titanate (Ba, Sr)TiO$_3$, it is preferable to carry out the rapid thermal annealing at 600 degrees to 900 degrees in centigrade for 1 second to 240 seconds. It is more preferable to carry out the rapid thermal annealing at 650 degrees to 800 degrees in centigrade for 1 second to 60 seconds. If the crystallization is carried out in a furnace, the heat treatment is continued for 1 minute to 480 minutes at 520 degrees to 800 degrees in centigrade. It is more preferable to carry out the heat treatment in the furnace at 550 degrees to 650 degrees in centigrade for 10 minutes to 120 minutes. As a result, the lower capacitor electrode 22, the anti-silicon diffusion conductive layer 21 and the silicon contact layer 20 are covered with the barium strontium titanate layer 23 with the perovskite structure as shown in FIG. 2H.

After the heat treatment, ruthenium is deposited to 50 nanometers thick over the entire surface of the barium strontium titanate layer 23 with the perovskite structure by using the direct current sputtering. The ruthenium forms the upper capacitor electrode 24.

Finally, the resultant semiconductor structure is subjected to a low temperature heat treatment. In detail, the resultant semiconductor structure is placed in the inert atmosphere containing oxygen at zero to 5 percent. The resultant semiconductor structure is heated to 250 degrees to 500 degrees in centigrade. The temperature range is lower than the above-described crystallizing temperature. The low temperature heat treatment may be carried out at 300 degrees in centigrade for 30 minutes. Although the barium strontium titanate contains a non-ignoreable amount of carbon and hydrogen, the carbon and the hydrogen are eliminated from the barium strontium titanate layer 23 in the low temperature heat treatment.

The dielectric constant $\in$ of the substance is raised over 50 through the high temperature heat treatment. However, the low temperature heat treatment is not expected to crystallize the material. For this reason, the low temperature heat treatment is carried out at least 20 degrees lower than the temperature range of the high temperature heat treatment. The temperature range of the low temperature heat treatment is lower than the crystallizing temperature by 150 degrees to 400 degrees in centigrade.

The present inventors evaluated the capacitor 11. The present inventors fabricated the prior art capacitors and the capacitors according to the present invention on the substrates. The prior art capacitors had the dielectric layers of the substance with the perovskite structure, and the substance was crystallized through the high temperature heat treatment described in conjunction with FIG. 2H. However, the dielectric layers were not subjected to the low temperature heat treatment after the deposition of the ruthenium for the upper capacitor electrodes. On the other hand, the capacitors 11 according to the present invention had the dielectric layers 23 of the substance with the perovskite structure. The substance was crystallized through the high temperature heat treatment, and the dielectric layers 23 were further subjected to the low temperature heat treatment for the elimination of the carbon and hydrogen.

Figure 3:
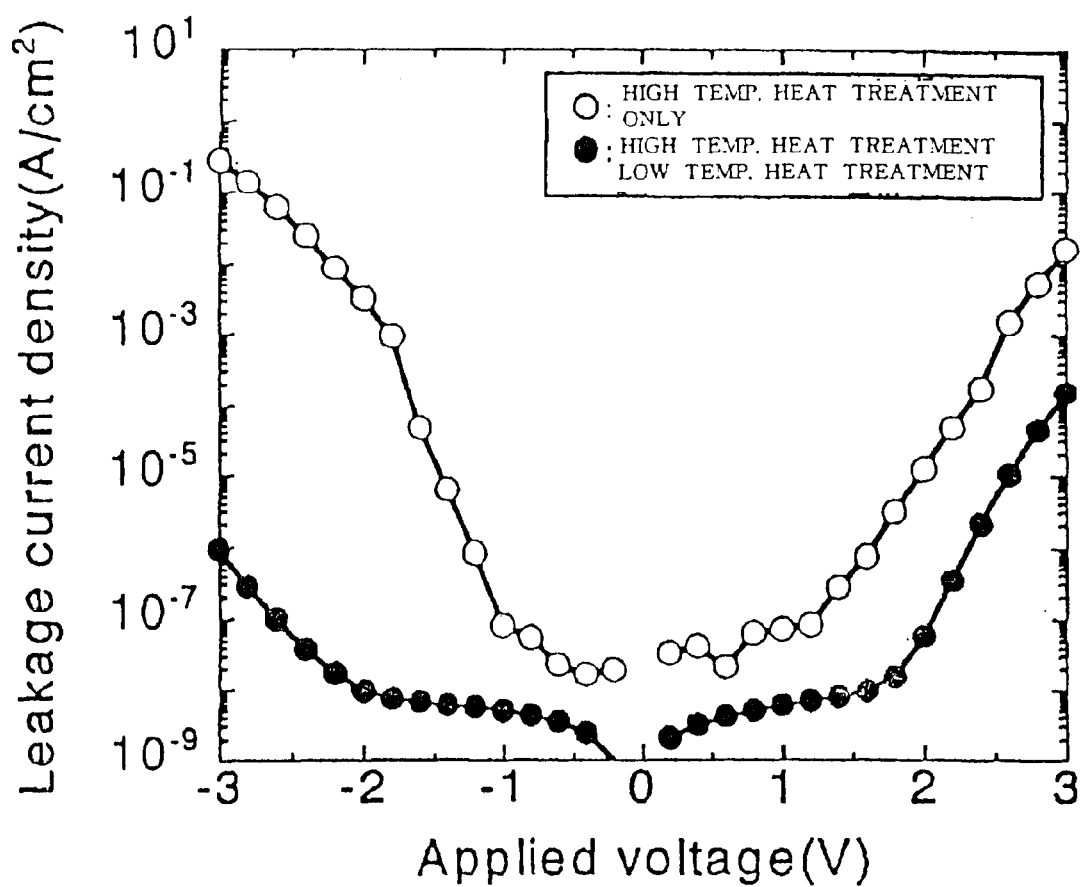
FIG. 3 is a graph showing relation between leakage current density and an applied voltage.

The prior art capacitors and the capacitors 11 according to the present invention were applied with potential difference between the lower capacitor electrodes and the upper capacitor electrodes, and the leakage current density was measured. The leakage current density in the prior art capacitor was varied as indicated by small circles (see. FIG. 3). On the other hand, the leakage current density in the capacitors 11 was varied as indicated by dots. Comparing the leakage current density in the prior art capacitor with the leakage current density in the capacitor 11 according to the present invention, the amount of leakage current density in the capacitor according to the present invention was smaller than the amount of leakage current density in the prior art capacitor in the range between −3 volts and +3 volts. When the applied voltage was between −2 volts and +2 volts, the leakage current density in the capacitor 11 according to the present invention was reduced to the level of $1.10^{-8}$ ampere/cm$^2$. Thus, the low temperature annealing was effective against the leakage current cross the dielectric layer. The leakage current was due to the carbon and the hydrogen contained in the layer with the perovskite structure. It was understood that the carbon and the hydrogen were eliminated through the low temperature heat treatment.

The dielectric layer 23 is improved in leakage current through the low temperature heat treatment. Even if the dielectric layer 23 is reduced in thickness, the capacitor 11 exhibits good data holding characteristics. This results in increase of the capacitance. Thus, the low temperature heat treatment is desirable for the capacitor fabricated on the semiconductor substrate.

As will be understood from the foregoing description, the low temperature heat treatment at 250 degrees to 500 degrees in centigrade makes the impurities such as carbon and hydrogen eliminated from the substance with the perovskite structure, and is effective against the leakage current and decrease of dielectric constant. In case where the capacitor forms a part of the dynamic random access memory cell, the data holding characteristics are surely improved.

The low temperature heat treatment is carried out in the inert atmosphere containing oxygen at zero to 5 percent. The low oxygen containing inert atmosphere is effective against the oxidation of the ruthenium.

Figure 4:
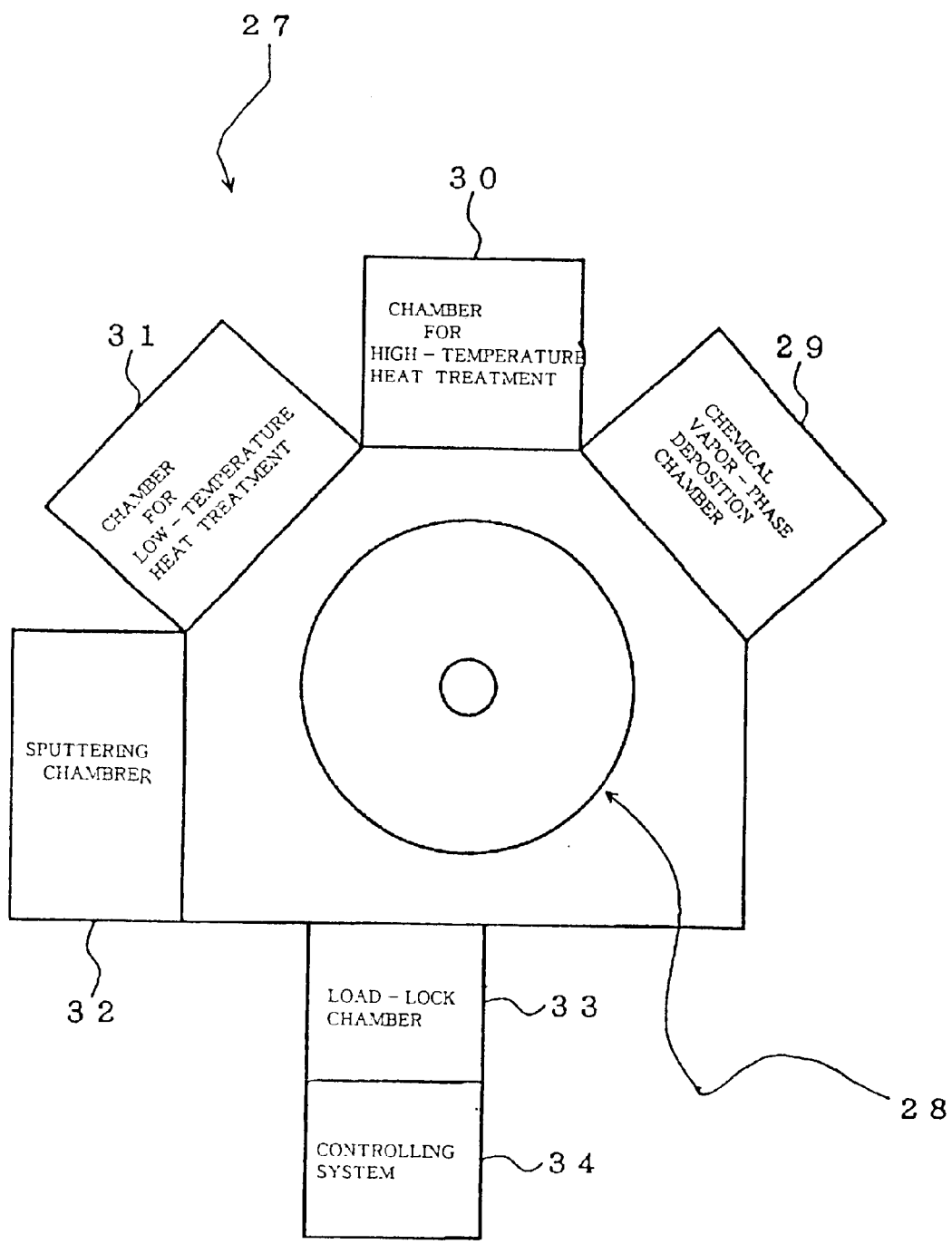
FIG. 4 is a schematic plane view showing the layout of chambers incorporated in a fabrication apparatus used in a process for fabricating a capacitor according to the present invention.

Turning to FIG. 4 of the drawings, an fabrication apparatus 27 according to the present invention comprises a wafer transfer system 28, plural chambers 29, 30, 31, 32 and 33 and a controlling system 34. The fabrication apparatus is categorized in a single wafer processing system, and a wafer carrier (not shown) is conveyed from a chamber to another chamber by means of the wafer transfer system 28. The chambers 29, 30, 31, 32 and 33 are arranged around the wafer transfer system 28. The wafers are loaded into and taken out from the chamber 33 called as "load-lock chamber". The other chambers 29, 30, 31 and 32 are assigned to the deposition of substance, the high temperature heat treatment 30, the low temperature heat treatment 31 and the deposition of conductive material for the upper capacitor electrode 24.

Plural silicon wafers are retained in the wafer carrier, and the wafer carrier is loaded into the fabrication apparatus through the load-lock chamber 33, and the wafer carrier is conveyed from the load-lock chamber 33 through the other chambers 29, 30, 31 and 32 in the predetermined order by means of the wafer transfer system 28. While the wafer carrier is being transferred through the chambers 29, 30, 31 and 32, the wafer carrier and, accordingly, the silicon wafers are never exposed to the atmosphere. The deposition of substance is carried out in the chamber 29, and the high temperature heat treatment is carried out in the chamber 30 for the crystallization. The chamber 32 is used for the deposition of ruthenium, and the low temperature heat treatment is carried out in the chamber 31 for eliminating the impurities. As will be described hereinlater in detail, the wafer carrier may be transferred in another order. Finally, the wafer carrier is taken out from the fabrication apparatus 27 through the load-lock chamber 33. The ruthenium layer is patterned into the upper capacitor electrode 24 outside of the fabrication apparatus 27. The depositions, the two kinds of heat treatment and the conveying are controlled by means of the controlling system 34.

The wafer transfer system 28 may convey the wafer carrier from the load-lock chamber 33 through the deposition chamber 29, the chamber 31 for the low temperature heat treatment, the chamber 30 for the high temperature heat treatment and the sputtering chamber 32 to the load-lock chamber 33. Otherwise, the wafer transfer system 28 may convey the wafer carrier from the load-lock chamber 33 through the deposition chamber 29, the chamber 30 for the high temperature heat treatment, the sputtering chamber 32 and the chamber 31 for the low temperature heat treatment to the load-lock chamber 33. It is desirable that he high temperature heat treatment and the low temperature heat treatment are carried out before the deposition of the conductive material for the upper capacitor electrode 24.

The ruthenium layer is formed into the upper capacitor electrode 24 through an etching. If the formation of upper capacitor electrode 24 is arranged between the two kinds of heat treatments, either high temperature heat treatment or low temperature heat treatment is carried out after the etching. The etching system is separated from the fabrication apparatus. The silicon wafers are to be loaded into the fabrication apparatus twice. On the other hand, the formation of upper capacitor electrode is divided into the deposition of ruthenium and the etching. The deposition of ruthenium, the high temperature heat treatment and the low temperature heat treatment are continuously carried out, and, thereafter, the ruthenium layer is patterned into the upper capacitor electrode 24 through the etching.

Although particular embodiments of the present invention have been shown and described, it will be apparent to those skilled in the art that various changes and modifications may be made without departing from the spirit and scope of the present invention.

The lower capacitor electrode layer 22 may be formed of platinum or conductive material with the perovskite structure such as, for example, $SrRuO_3$.

Although the low temperature heat treatment for the elimination of the impurities and the high temperature heat treatment for the crystallization are required for the capacitor according to the present invention, the manufacturer can arrange the two kinds of heat treatment in the fabrication process. The high temperature heat treatment and the low temperature heat treatment are to be carried out after the growth of the material. However, the low temperature heat treatment may be carried out before the high temperature heat treatment or before the formation of the upper capacitor electrode. The steps may be arranged as follows. The fabrication process may have the following process sequence. The deposition of substance such as the barium strontium titanate, the two kinds of heat treatment and the formation of upper capacitor electrode may be arranged as the deposition of substance, the high temperature heat treatment after the deposition, the formation of the upper capacitor electrode after the high temperature heat treatment and the low temperature heat treatment carried out after the formation;

the deposition of substance, the low temperature heat treatment carried out after the deposition, the high temperature heat treatment carried out after the low temperature heat treatment and the formation of upper capacitor electrode;

the deposition of substance, the high temperature heat treatment carried out after the deposition, the low temperature heat treatment carried out after the high temperature heat treatment and the formation of upper capacitor electrode; or the deposition of substance, the formation of upper capacitor electrode, the high temperature heat treatment and the low temperature heat treatment.

The deposition of material and the high temperature heat treatment may be repeated plural times. In this instance, the low temperature heat treatment is carried out after the repetition. Furthermore, the deposition of material, the high temperature heat treatment and the low temperature heat treatment may be repeated.

The low temperature heat treatment under the crystallizing temperature is effective against the impurities contained in the complex oxide with the perovskite structure expressed as $ABO_3$ such as, for example, $ABO_3$ type complex oxide in Pb system In the above description, the chemical expression "$ABO_3$" stands perovskite oxide. In the chemical expression, "A" is selected from the group consisting of Ba, Sr and Pb, and "B" is selected from the group consisting of Ti, Zr and Hf.

What is claimed is:

1. A process for fabricating a capacitor, comprising the steps of:

a) preparing semiconductor structure having a semiconductor substrate;

b) forming a first electrode on said semiconductor structure;

c) depositing ferroelectric complex oxide expressed as $ABO_3$ on said lower electrode;

d) completing a capacitor through a high temperature heat treatment for crystallizing said ferroelectric complex oxide, and a low temperature heat treatment for eliminating impurities causative of degradation from said ferroelectric complex oxide, wherein said high temperature heat treatment and said low temperature heat treatment are conducted in an inert, low oxygen atmosphere, in which the oxygen concentration ranges from 0 to 5 percent;

e) repeating said high temperature heat treatment and said low temperature heat treatment; and f) forming a second electrode on said ferroelectric complex oxide.

2. A process for fabricating a capacitor, comprising the steps of:

a) preparing semiconductor structure having a semiconductor substrate;

b) forming a first electrode on said semiconductor structure;

c) depositing a ferroelectric complex oxide expressed as $ABO_3$ on said lower electrode; and d) completing a capacitor by conducting a low temperature heat treatment for eliminating impurities causative of degradation from said ferroelectric complex oxide and then in the next step conducting a high temperature heat treatment for crystallizing said ferroelectric complex oxide in a temperature range for crystallizing said ferroelectric complex and finally forming a second electrode on said ferroelectric complex said low temperature heat treatment being conducted at a temperature lower than the high temperature heat treatment, wherein said high temperature heat treatment and said low temperature heat treatment are conducted in an inert, low oxygen atmosphere, in which the oxygen concentration ranges from 0 to 5 percent.

3. A process for fabricating a capacitor, comprising the steps of:

a) preparing semiconductor structure having a semiconductor substrate;

b) forming a first electrode on said semiconductor structure;

c) depositing ferroelectric complex oxide expressed as $ABO_3$ on said lower electrode; and d) completing a capacitor by conducting a high temperature heat treatment for crystallizing said ferroelectric complex oxide in a temperature range for crystallizing said ferroelectric complex oxide, and then in the next step conducting a low temperature heat treatment for eliminating impurities causative of degradation from said ferroelectric complex oxide at a temperature range below that of the high temperature heat treatment, and finally forming a second electrode on said ferroelectric complex, wherein said high temperature heat treatment and said low temperature heat treatment are conducted in an inert, low oxygen atmosphere, in which the oxygen concentration ranges from 0 to 5 percent.

4. A process for fabricating a capacitor, comprising the steps of:

a) preparing semiconductor structure having a semiconductor substrate;

b) forming a first electrode on said semiconductor structure;

c) depositing a ferroelectric complex oxide expressed as $ABO_3$ on said lower electrode; and d) first forming a second electrode, then conducting a high temperature heat treatment for crystallizing said ferroelectric complex oxide in a temperature range in a temperature range for crystallizing said ferroelectric complex oxide, and conducting a low temperature heat treatment for eliminating impurities causative of degradation from said ferroelectric complex oxide at a temperature range lower than the high temperature heat treatment, wherein said high temperature heat treatment and said low temperature heat treatment are conducted in an inert, low oxygen atmosphere, in which the oxygen concentration ranges from about 0 to 5 percent.

5. The process according to claim 1, in which said ferooelectic complex oxide has a pervoskite structure.

6. The process according to claim 2, in which said ferooelectic complex oxide has a pervoskite structure.

7. The process according to claim 3, in which said ferooelectic complex oxide has a pervoskite structure.

8. The process according to claim 4, in which said ferooelectic complex oxide has a pervoskite structure.

9. The process set forth in claim 1, in which said low temperature heat treatment is conducted in an inert atmosphere.

10. The process set forth in claim 2, in which said low temperature heat treatment is conducted in an inert atmosphere.

11. The process set forth in claim 3, in which said low temperature heat treatment is conducted in an inert atmosphere.

12. The process set forth in claim 4, in which said low temperature heat treatment is conducted in an inert atmosphere.

13. The process as set forth in claim 1, in which said ferroelectric complex oxide is expressed as $(Ba, Sr)TiO_3$, and said high temperature heat treatment and said low temperature heat treatment are carried out in a first temperature range between 520 degrees and 900 degrees in centigrade and in a second temperature range between 250 degrees and 500 degrees in centigrade, respectively.

14. The process as set forth in claim 2, in which said ferroelectric complex oxide is expressed s $(Ba, Sr)TiO_3$, and said high temperature heat treatment and said low temperature heat treatment are carried out in a first temperature range between 520 degrees and 900 degrees in centigrade and in a second temperature range between 250 degrees and 500 degrees in centigrade, respectively.

15. The process as set forth in claim 3, in which said ferroelectric complex oxide is expressed as $(Ba, Sr)TiO_3$, and said high temperature heat treatment and said low temperature heat treatment are carried out in a first temperature range between 520 degrees and 900 degrees in centigrade and in a second temperature range between 250 degrees and 500 degrees in centigrade, respectively.

16. The process as set forth in claim 4, in which said ferroelectric complex oxide is expressed as $(Ba, Sr)TiO_3$, and said high temperature heat treatment and said low temperature heat treatment are carried out in a first temperature range between 520 degrees and 900 degrees in centigrade and in a second temperature range between 250 degrees and 500 degrees in centigrade, respectively.

* * * * *

UNITED STATES PATENT AND TRADEMARK OFFICE
CERTIFICATE OF CORRECTION

PATENT NO.     : 6,602,722 B2
DATED          : August 5, 2003
INVENTOR(S)    : Ichiro Yamamoto et al.

It is certified that error appears in the above-identified patent and that said Letters Patent is hereby corrected as shown below:

Title page,
Item [22], insert the following:
-- [30] Foreign Application Priority Data
Dec. 16, 1999  (JP)  Japan…………11-356894 --

Signed and Sealed this

Eleventh Day of November, 2003

JAMES E. ROGAN
*Director of the United States Patent and Trademark Office*